United States Patent [19]

Shimizu et al.

[11] Patent Number: 5,759,751
[45] Date of Patent: Jun. 2, 1998

[54] METHOD OF PEELING PHOTO-RESIST LAYER WITHOUT DAMAGE TO METAL WIRING

[75] Inventors: Yuji Shimizu; Kohiro Ito; Masashige Moritoki, all of Tokyo, Japan

[73] Assignee: NEC Corporation, Tokyo, Japan

[21] Appl. No.: 795,631

[22] Filed: Feb. 6, 1997

[30] Foreign Application Priority Data

Feb. 8, 1996 [JP] Japan ................... 8-022299

[51] Int. Cl.$^6$ ................... G03C 5/00
[52] U.S. Cl. ................... 430/329; 430/256; 430/325; 430/331
[58] Field of Search ................... 430/325, 326, 430/329, 331, 256

[56] References Cited

U.S. PATENT DOCUMENTS 4,714,517 12/1987 Malladi et al. ................... 156/629
5,308,745 5/1994 Schwartzkopf ................... 430/329
5,578,193 11/1996 Aoki et al. ................... 205/746

FOREIGN PATENT DOCUMENTS 6-260480 9/1994 Japan.

OTHER PUBLICATIONS

Inorganic Chemistry, 2nd ed., J.E. Huheey, Haper & Row, NY, 1978, pp. 258–259.

*Primary Examiner*—Janet C. Baxter
*Assistant Examiner*—Rosemary Ashton
*Attorney, Agent, or Firm*—Foley & Lardner

[57] ABSTRACT

A semiconductor manufacturer peels a photo-resist mask off by using organic alkaline solvent, and the residual alkaline solvent is neutralized with acid before a rinse in pure water so as to prevent a metal wiring from erosion due to strong alkaline solution produced from the residual organic alkaline solvent.

14 Claims, 10 Drawing Sheets

METHOD OF PEELING PHOTO-RESIST LAYER WITHOUT DAMAGE TO METAL WIRING

FIELD OF THE INVENTION

This invention relates to semiconductor fabrication technologies and, more particularly, to a method of peeling causing photo-resist layer off without a damage to a metal wiring.

DESCRIPTION OF THE RELATED ART

While a manufacturer is fabricating an integrated circuit on a semiconductor wafer, a polysilicon layer and a metal layer are patterned into conductive layers, and a contact hole and a via-hole are formed in insulating layers. Such a miniature patterning is usually achieved by using a lithography. Photo-resist solution is first spread over the conductive/insulating layer, and the conductive/insulating layer is overlain by a photo-resist layer. A pattern image is optically transferred from a photo-mask to the photo-resist layer, and a latent image is formed in the photo-resist layer. The latent image is developed, and the photo-resist layer is formed into a photo-resist etching mask. Using the photo-resist etching mask, the manufacturer patterns the conductive/insulating layer through a wet etching or a dry etching. The photo-resist etching mask exposes a part of the conductive/insulating layer to etchant, and the etchant removes the part of the conductive/insulating layer. Upon completion of the wet/dry etching, the photo-resist etching mask is stripped off, and FIGS. 1A to 1C illustrate the post treatment after the wet/dry etching.

In FIG. 1A, a lower wiring 1 of aluminum is formed on an insulating layer 2 of silicon oxide, and is covered with an inter-level insulating layer 3 of silicon oxide. A photo-resist etching mask 4 is formed on the inter-level insulating layer 3, and has a hollow space 4a over the lower wiring 1. A part of the inter-level insulating layer 3 is exposed to the hollow space 4a, and is etched away by using a reactive etching technique. When the reactive etching is terminated, a via-hole 3a is formed in the inter-level insulating layer 3, and the inner surface of the inter-level insulating layer 3 and the inner surface of the photo-resist etching mask 4 are covered with reaction product 5 between the gaseous etchant and the silicon oxide as shown in FIG. 1A.

Subsequently, the photo-resist etching mask 4 is stripped off, and the reaction product 5 is removed from the resultant structure. The lower wiring 1 and the inter-level insulating layer appear on the surface as shown in FIG. 1B.

The via-hole 3a is usually used for an interconnection between the lower wiring 1 and an upper wiring. A lamination of titanium nitride film and titanium film is deposited over the entire surface of the resultant structure shown in FIG. 1B, and aluminum is further deposited on the lamination. The lithography is repeated for a photo-resist etching mask (not shown), and the aluminum layer and the lamination of titanium nitride film and titanium film are patterned into an upper wiring 6 as shown in FIG. 1C. The upper wiring 6 consists of a titanium nitride/titanium layer 6a and an aluminum layer 6b.

The peeling/cleaning stage is described hereinbelow in detail. There are three peeling/cleaning technologies. The first peeling/cleaning technology is called "ashing". The photo-resist etching mask 4 is exposed to oxygen plasma during the ashing so that the oxygen plasma ashes the photo-resist etching mask 4. However, the oxygen plasma is not effective against the reaction product 5, and the reaction product 5 is undesirably left on the inner surface of the inter-level insulating layer 3. For this reason, ashing is not appropriate in a case where the reaction product is expected.

The second peeling/cleaning technology is to expose photo-resist etching mask 3 to solution mainly containing sulfuric acid and hydrogen peroxide. The photo-resist etching mask 4 peels off in the solution. However, the solution penetrates into the via-hole 3a, and undesirably etches the aluminum. Thus, the second peeling/cleaning technology damages the lower wiring 1, and is not recommended for the formation of the via-hole 3a.

The third peeling/cleaning technology is to expose the photo-resist etching mask 4 to organic alkaline solvent. The exposure to the organic alkaline solvent is illustrated in FIG. 2 of the drawings. The prior art wet cleaning system has three vessels 8a, 8b and 8c. The first vessel 8a is filled with organic alkaline solvent 9a, and isopropyl alcohol 9b fills the second vessel 8b. A rinse is carried out in the third vessel 8c, and pure water 9c is circulated through the third vessel 8c.

The semiconductor wafers 10 covered with the photo-resist etching masks 4 are placed in a boat 11, and the boat 11 is dipped into the organic alkaline solvent 9a. The organic alkaline solvent 9a peels the photo-resist etching masks 4 off, and removes the reaction product 5. The boat 11 is pulled up after a certain time period, and is dipped into the isopropyl alcohol 9b. The residual organic alkaline solvent on the semiconductor wafers 10 is replaced with the isopropyl alcohol. If the semiconductor wafers 10 are directly moved from the first vessel 8a to the third vessel 8c, the residual organic alkaline solvent produces strong alkaline solution, and the strong alkaline solution erodes the lower wiring 1. For this reason, the semiconductor wafers 10 are dipped into the isopropyl alcohol 9b before the rinse in the pure water 9c.

In the third vessel 8c, the semiconductor wafers 10 are rinsed, and, thereafter, the process proceeds to the deposition of the titanium/titanium nitride. The isopropyl alcohol 9b does not produce strong alkaline solution, and the lower wiring 1 is never damaged.

Thus, the third peeling/cleaning technology is theoretically free from the problems in the first and second peeling/cleaning technologies. However, the lower wiring 1 is eroded. The erosion causes the upper wiring 6 to increase the resistance in the contact hole 3a or be disconnected from the lower wiring 1 as shown in FIG. 3.

SUMMARY OF THE INVENTION

It is therefore an important object of the present invention to provide a method of peeling a photo-resist layer off which does not damage an inter-level connection between a lower metal wiring and an upper wiring nor increases the resistance in a contact hole.

The present inventors contemplated the problem, and noticed that contact holes had been miniaturized. The contact holes of an ultra large scale integration had a large aspect ratio. If the organic alkaline solvent penetrated into the miniature contact holes, the residual organic alkaline solvent was not perfectly replaced with the isopropyl alcohol, and produced the strong alkaline solution in the contact holes. The present inventors concluded that the residual organic alkaline solvent was causative of the damage of lower metal wirings.

To accomplish the object, the present invention proposes to treat a semiconductor wafer with acid after the peeling off in organic alkaline solvent.

In accordance with the present invention, there is provided a method of peeling a photo-resist layer from a semiconductor structure, comprising the steps of: a) preparing a semiconductor structure partially covered with a photo-resist layer; b) treating the semiconductor structure and the photo-resist layer with organic alkaline solvent for peeling the photo-resist layer off; c) treating the semiconductor structure with acid for neutralizing residue of the organic alkaline solvent; and d) treating the semiconductor structure with pure water for cleaning.

A treatment with alcohol is further carried out between the step b) and the step c).

BRIEF DESCRIPTION OF THE DRAWINGS

The features and advantages of the method according to the present invention will be more clearly understood from the following description taken in conjunction with the accompanying drawings, in which.

DESCRIPTION OF THE PREFERRED EMBODIMENTS

First Embodiment

Figure 1A:
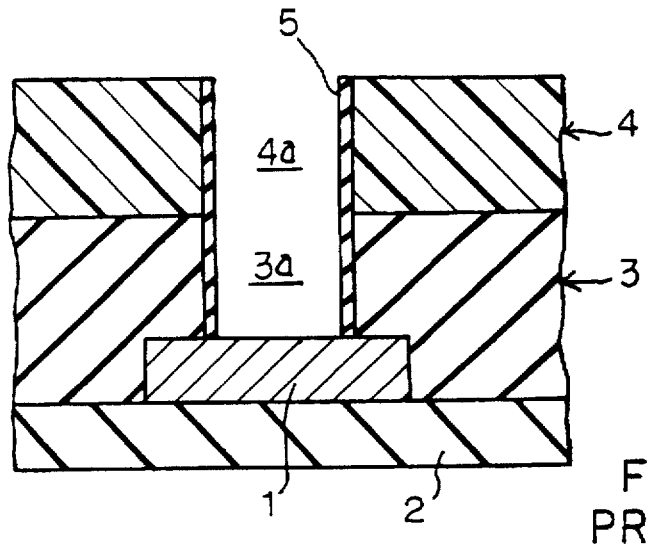
FIGS. 1A to 1C are cross sectional views showing a prior art method of peeling a photo-resist etching mask off.
Figure 1B:
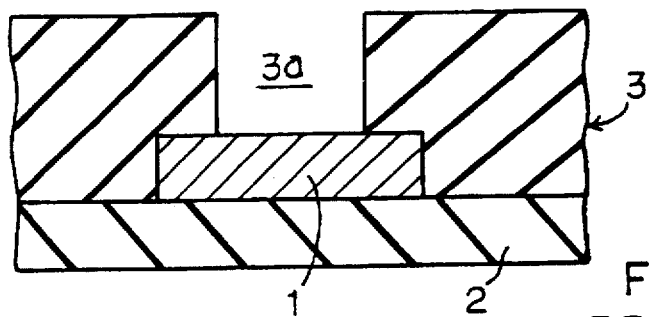
Figure 4:
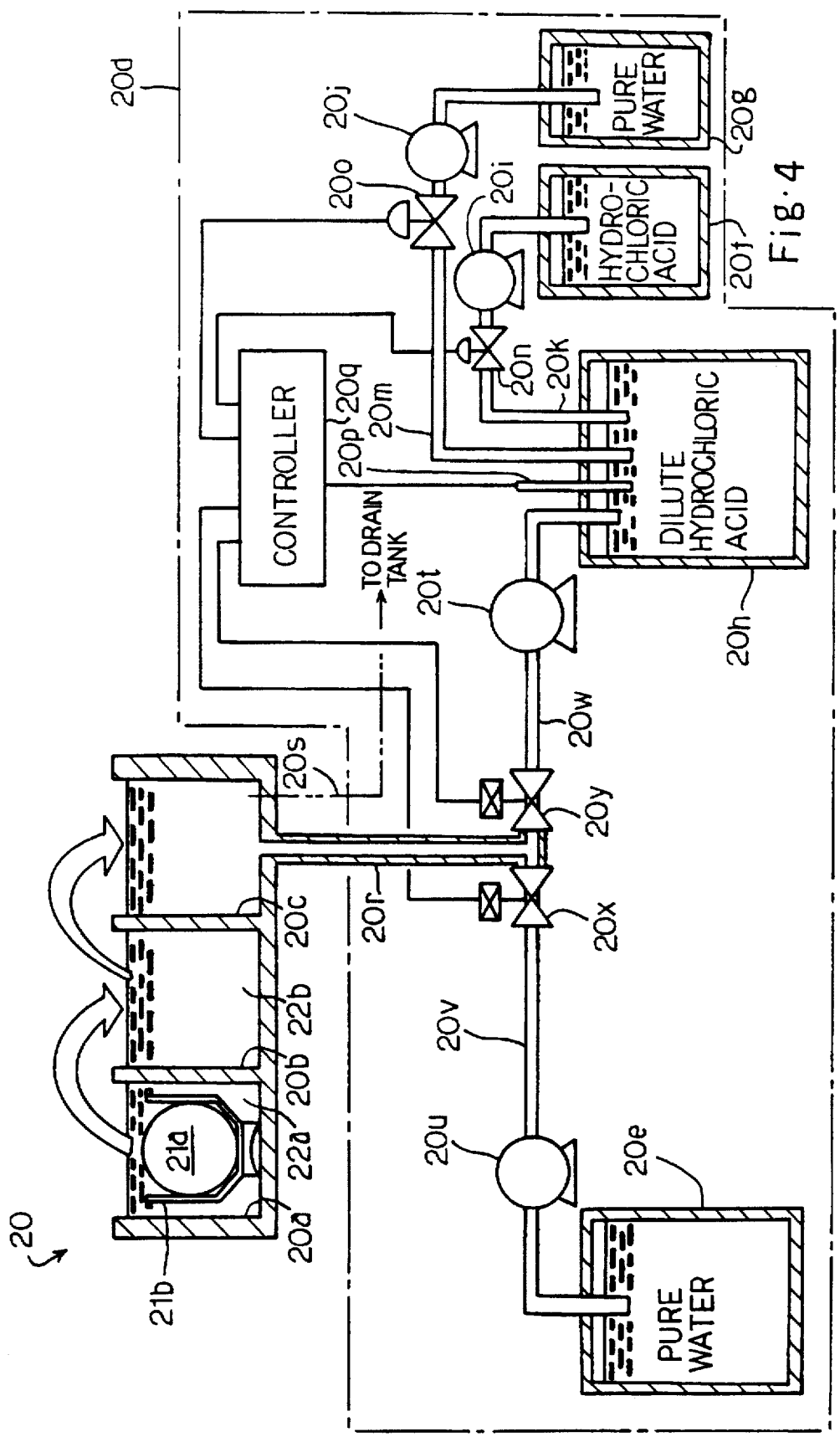
FIG. 4 is a schematic view showing a wet treatment system used in a method according to the present invention.

Referring to FIG. 4 of the drawings, a wet treatment system 20 largely comprises three vessels 20a, 20b and 20c and a liquid exchanging sub-system 20d, and semiconductor wafers 21a are treated in the wet treatment system 20. The semiconductor wafer 21a includes a plurality of small portions each assigned to an integrated circuit, and the small portion has the cross section shown in FIG. 1A. For this reason, layers and holes of the small portion are identified by the same references used in FIG. 1A, and the semiconductor wafer 21a, the lower insulating layer 2, the lower wiring 1 and the inter-level insulating layer 3 as a whole constitute a semiconductor structure.

The first vessel 20a is filled with organic alkaline solvent 22a for peeling the photo-resist etching mask 4 off, and isopropyl alcohol 22b fills the second vessel 20b. Though not shown in FIG. 4, the organic alkaline solvent 22a and the isopropyl alcohol 22b are supplied from reservoir tanks through conduits to the first and second vessels 20a/20b, and the first and second vessels 20a/20b are further connected through drain pipes to a drain tank. The third vessel 20c is connected to the liquid exchanging sub-system 20d, and one of dilute acid such as, for example, dilute hydrochloric acid and pure water fills the third vessel 20c as will be described hereinlater. The dilute acid may be dilute sulfuric acid or nitric acid.

The liquid exchanging sub-system 20d includes three reservoir tanks 20e, 20f and 20g and a mixing tank 20h. The reservoir tanks 20e and 20g store pure waters, and the other reservoir tank 20f stores hydrochloric acid. Conveying pumps 20i and 20j respectively transfer the hydrochloric acid and the pure water from the reservoir tanks 20f/20g through conduits 20k and 20m to the mixing tank 20h. Solenoid-operated flow control valves 20n and 20o are inserted into the conduits 20k and 20m, and the solenoid-operated flow control valves 20n and 20o controls the flow rate of the hydrochloric acid and the flow rate of the pure water, respectively. A pH detector 20o monitors the dilute hydrochloric acid, and reports the detected pH to a controller 20pq. The controller 20q independently changes the valve positions of the solenoid-operated flow control valves 20n and 20o, and regulates the pH of the dilute hydrochloric acid to 5. In this instance, the target pH is 5. However, the dilute hydrochloric acid may range from pH4 to pH6.

A conduit 20r is open to the third vessel 20c, and the third vessel 20c is connected through a drain pipe 20s to the drain tank (not shown). Conveying pumps 20t and 20u transfer the dilute hydrochloric acid and the pure water through conduits to the conduit 20r, and solenoid-operated stop valves 20x and 20y are inserted between the conduits 20v/20w and the conduit 20r. The solenoid-operated stop valves 20x/20y are controlled by the controller 20q.

Using the wet treatment system 20, a manufacturer peels the photo-resist etching mask 4 from the semiconductor structure, and cleans the semiconductor structure as follows. First, the first, second and third vessels 20a to 20c are respectively filled with the organic alkaline solvent 22a, the isopropyl alcohol 22b and the dilute hydrochloric acid. In order to fill the third vessel 20c with the dilute hydrochloric acid, the liquid exchanging sub-system 20d behaves as follows. The controller 20q actuates the conveying pumps 20i and 20j so as to transfer the hydrochloric acid and the pure water from the reservoir tanks 20f/20g to the mixing tank 20h. The pH detector 20p reports the pH of the dilute hydrochloric acid to the controller 20q, and the controller 20q regulates the pH of the dilute hydrochloric acid to 5 through the solenoid-operated flow control valves 20n/20o. When the dilute hydrochloric acid is regulated to the target pH, the controller 20q actuates the conveying pump 20t, and changes the solenoid-operated stop valves 20x and 20y to a closed state and an open state, respectively. Then, the dilute hydrochloric acid is supplied to the third vessel 20c, and fills it.

When the organic alkaline solvent 22a, the isopropyl alcohol 22b and the dilute hydrochloric acid are prepared in the first vessel 20a, the second vessel 20c and the third vessel 20c, respectively, the manufacturer dips the semiconductor wafers 21a mounted on the boat 21b into the organic alkaline solvent 22a for a certain time period. The photo-resist etching mask 4 is peeled off in the organic alkaline solvent 22a, and the organic alkaline solvent 22a may remain in the contact hole 3a.

The semiconductor wafers 21a are lifted from the organic alkaline solvent 22a together with the boat 21b, and are dipped into the isopropyl alcohol 22b for 1 certain time period. The residual organic alkaline solvent on the surface of the semiconductor structure is replaced with the isopropyl alcohol 22b. However, all the residual organic alkaline solvent in the via-holes 3a is not completely replaced with the isopropyl alcohol 22b, and may still remain.

The manufacturer lifts the semiconductor wafers 21a mounted on the boat 21b from the isopropyl alcohol 22b, and dips them into the dilute hydrochloric acid in the third vessel 20c for a certain time period. Even if the residual organic alkaline solvent remains in t he via-holes 3a, the dilute hydrochloric acid neutralizes the organic alkaline solvent. Thus, the organic alkaline solvent is perfectly removed from the semiconductor structure.

The certain time period for the neutralization is dependent on the configuration of the semiconductor structure such as, for example, the dimensions of the via-holes 3a. If the semiconductor structure is exposed to the dilute hydrochloric acid too long, the dilute hydrochloric acid erodes the lower wiring 1. For this reason, the manufacturer previously determines the optimum time period for each semiconductor structure, and terminates the neutralization upon expiration of the predetermined optimum time period.

When the neutralization is completed, the controller 20q discharges the dilute hydrochloric acid through the drain pipe 20s to the drain tank (not show), and starts the conveying pump 20u. The controller 20q changes the solenoid-operated stop valves 20x and 20y to the open state and the closed state, respectively, and the conveying pump 20u supplies the pure water through the conduits 20v and 20r to the third vessel 20c. The semiconductor wafers 21a are rinsed in the pure water for a certain time period.

The residual organic alkaline solvent has been already perfectly removed from the semiconductor structure, and strong alkaline solution is not produced in the via-holes 3a. For this reason, the semiconductor structure cleaned through the above described method is free from the undesirable disconnection.

Second Embodiment

Figure 5:
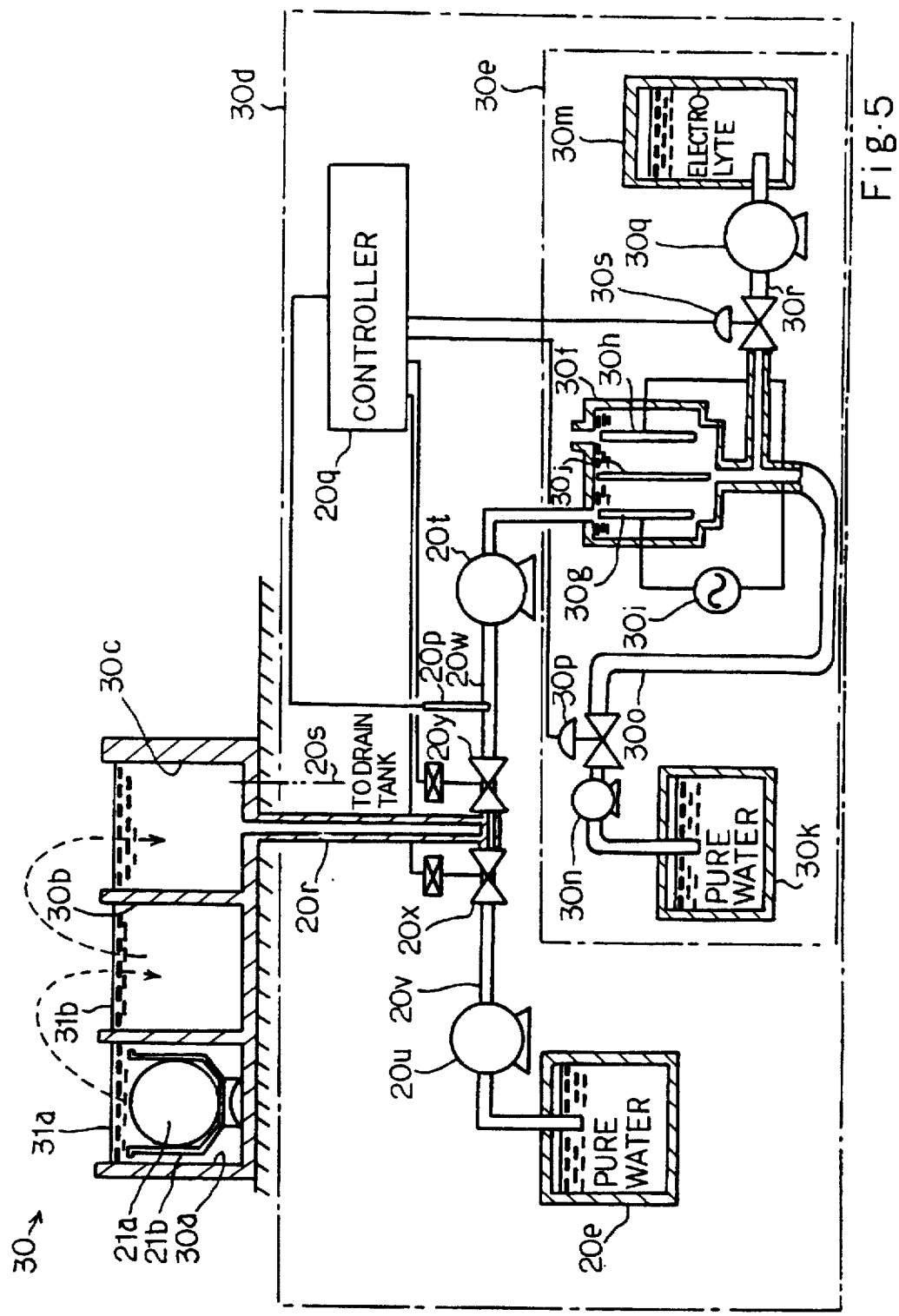
FIG. 5 is a schematic view showing another wet treatment system used in the method according to the present invention.

Turning to FIG. 5 of the drawings, another wet treatment system 30 embodying the present invention largely comprises three vessels 30a, 30b and 30c and a liquid exchanging sub-system 30d. Organic alkaline solvent 31a and isopropyl alcohol 31b fill the vessels 30a and 30b, respectively. The third vessel 30c is firstly filled with electrolyzed water, and the electrolyzed water is exchanged with pure water.

The liquid exchanging sub-system 30d is similar to the liquid exchanging sub-system 20d except for an electrolysis apparatus 30e, and, for this reason, other components are labeled with the references designating corresponding components of the liquid exchanging sub-system 20d without detailed description.

The electrolysis apparatus 30e includes electrolysis vessel 30f, a pair of electrodes 30g/30h connected to an ac power source 30i and a partition wall 30j provided between the electrodes 30g and 30h, and the electrolyzed water is produced through electrolysis in the electrolysis vessel 30f. The electrolyzed water is supplied from the electrolysis vessel 30f through the conduits 20w and 20r to the third vessel 30c by means of the conveying pump 20t, and the pH sensor 20p monitors the electrolyzed water passing through the conduit 20w.

The electrolysis apparatus 30e further includes a reservoir tank 30k for pure water and another reservoir tank 30m for electrolyte such as hydrochloric acid, ammonia water or carbonic water. A conveying pump 30n supplies the pure water through a conduit 30o to the electrolysis vessel 30f, and a solenoid-operated flow control valve 30p is inserted into the conduit 30o. Similarly, a conveying pump 30q supplies the electrolyte from the reservoir tank 30m through a conduit 30r to the electrolysis vessel 30f, and a solenoid-operated flow control valve 30s is inserted into the conduit 30r.

The controller 20q is responsive to an electric signal representative of pH of the electrolyzed water in the conduit 20w so as to regulate the pH of the electrolyed water to the target value, i.e. pH=5, through the solenoid-operated flow control valves 30p and 30s. Namely, the controller 20q changes the valve positions of the solenoid-operated flow control valves 30p and 30q in such a manner as to regulate the electrolyzed water to pH =5. A wet treatment using the electrolysis apparatus 30d is disclosed in Japanese Patent Application No. 5-105991, and no further description is incorporated hereinbelow.

Using the wet treatment system 30, a manufacturer peels the photo-resist etching mask 4 from the semiconductor structure, and cleans the semiconductor structure as follows. First, the first, second and third vessels 30a to 30c are respectively filled with the organic alkaline solvent 31a, the isopropyl alcohol 31b and the electrolyzed water. The electrolyzed water fills the third vessel 30c as similar to the dilute hydrochloric acid.

When the organic alkaline solvent 31a, the isopropyl alcohol 31b and the electrolyzed water are prepared in the first vessel 30a, the second vessel 30c and the third vessel 30c, respectively, the manufacturer dips the semiconductor wafers 21a mounted on the boat 21b into the organic alkaline solvent 31a for a certain time period. The photoresist etching mask 4 is peeled off in the organic alkaline solvent 31a, and the organic alkaline solvent 31a may remain in the contact hole 3a.

The semiconductor wafers 21a are lifted from the organic alkaline solvent 31a together with the boat 21b, and are dipped into the isopropyl alcohol 31b for a certain time period. The residual organic alkaline solvent 31a on the surface of the semiconductor structure is replaced with the isopropyl alcohol 31b. However, all the residual organic alkaline solvent in the via-holes 3a is not completely replaced with the isopropyl alcohol 31b, and some may still remain.

The manufacturer lifts the semiconductor wafers 21a mounted on the boat 21b from the isopropyl alcohol 31b, and dips them into the electrolyzed water in the third vessel 30c for a certain time period. Even if the residual organic alkaline solvent remains in the via-holes 3a, the electrolyzed water neutralizes the organic alkaline solvent. Thus, the organic alkaline solvent is perfectly removed from the semiconductor structure.

When the neutralization is completed, the controller 20q discharges the electrolyzed water through the drain pipe 20s to the drain tank (not show), and starts the conveying pump 20u. The controller 20q changes the solenoid-operated stop valves 20x and 20y to the open state and the closed state, respectively, and the conveying pump 20u supplies the pure water through the conduits 20v and 20r to the third vessel 3c. The semiconductor wafers 21a are rinsed in the pure water for a certain time period.

The residual organic alkaline solvent has been already perfectly removed from the semiconductor structure, and strong alkaline solution is not produced in the via-holes 3a. For this reason, the semiconductor structure cleaned through the above described method is free from the undesirable disconnection.

Moreover, the electrolyzed water does not erode the lower wiring 1 of aluminum, and it is not necessary for the manufacturer to strictly control the certain time period for the semiconductor structure in the electrolyzed water. Thus, the usage of electrolyzed water makes the peeling/cleaning method easy.

The manufacturer does not require a special waste water treatment system for the electrolyzed water, and, for this reason, the second embodiment is lower in construction cost and running cost than the first embodiment.

Figure 1C:
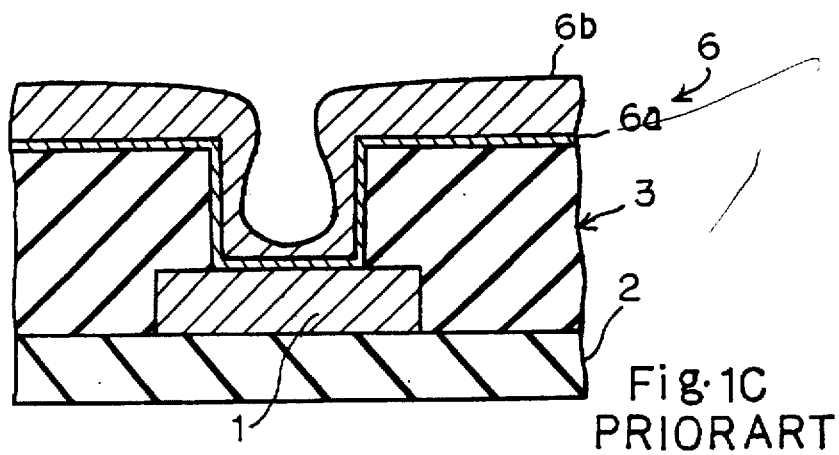
Figure 2:
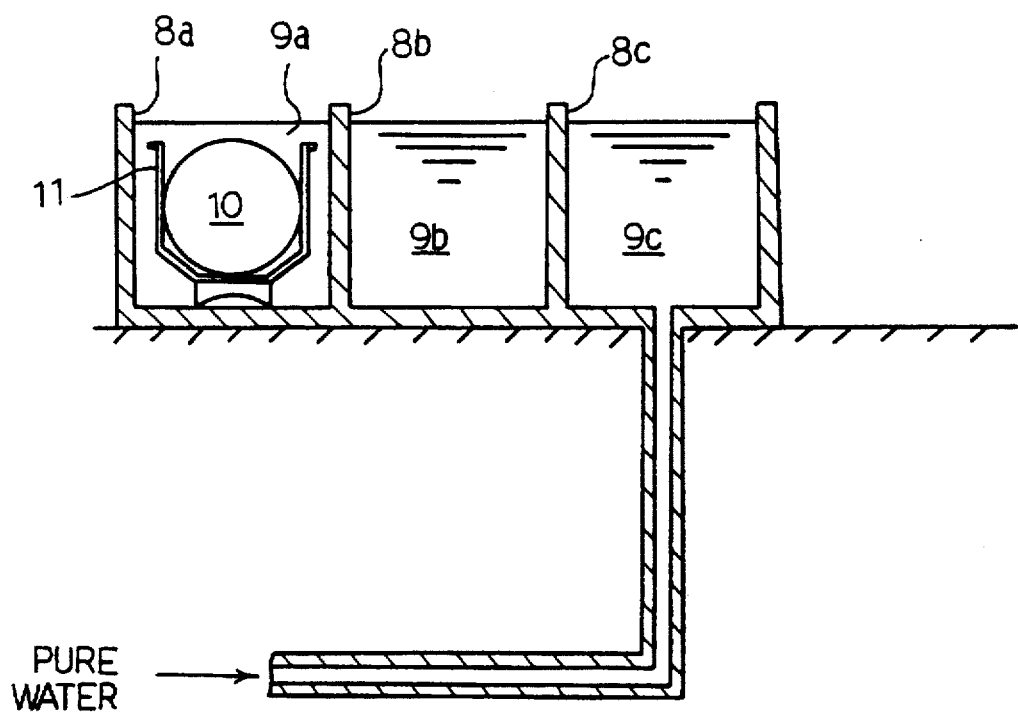
FIG. 2 is a schematic view showing a prior art wet treatment system.
Figure 3:
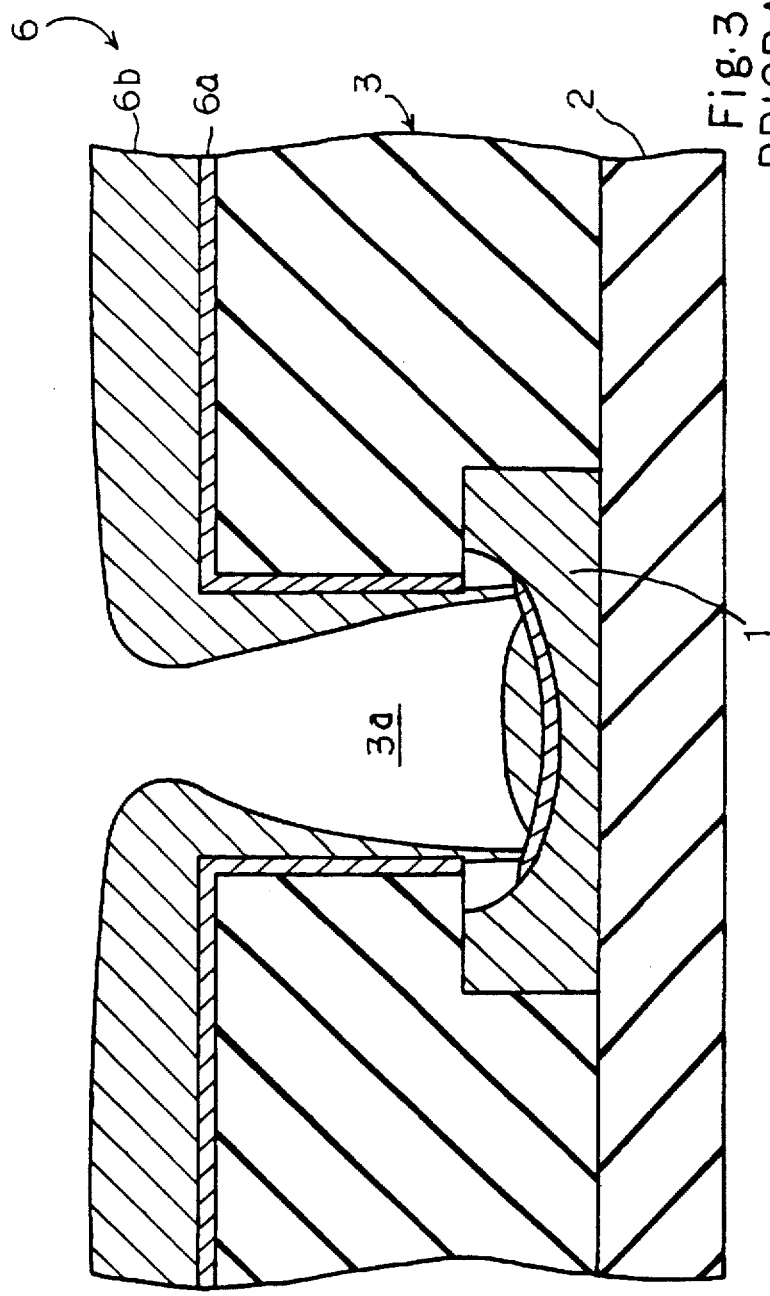
FIG. 3 is a cross sectional view showing the semiconductor waver after the prior art peeling/cleaning method.
Figure 6:
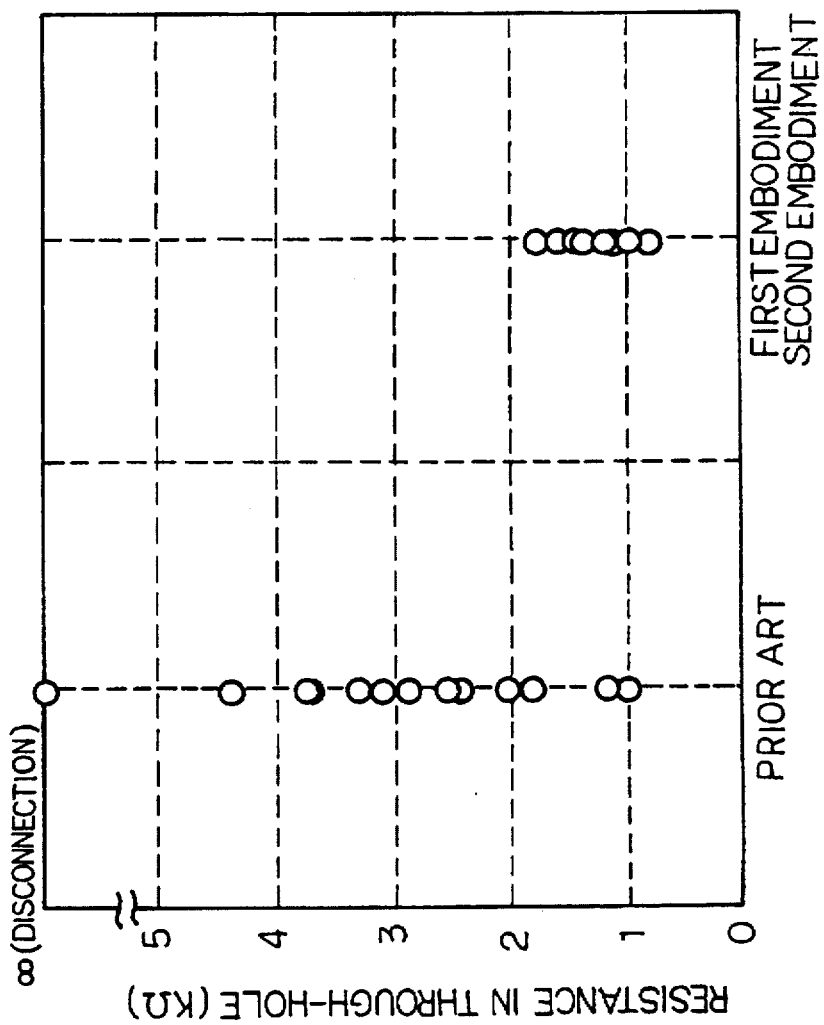
FIG. 6 is a graph showing the resistance in contact holes measured in the semiconductor structures treated with the method according to the present invention and the prior art method.

The present inventors evacuated the peeling/cleaning method implementing the first embodiment and the peeling/cleaning method implementing the second embodiment as follows. The present inventors fabricated the semiconductor structures shown in FIG. 1C. The samples had been divided into three groups, and each sample had a thousand via-holes 3a connected in series. The first group was treated through the peeling/cleaning method implementing the first embodiment, and the second group was treated through the peeling/cleaning method implementing the second embodiment. The third group was treated through the prior art peeling/cleaning method. Upon completion of the upper wirings 6, the present inventors measured the resistance of the thousand via-holes, and plotted the resistance as shown in FIG. 6. As will be understood from FIG. 6, the treatment with the acid solution was effective against the erosion due to the residual organic alkaline solvent.

Third Embodiment

Figure 7:
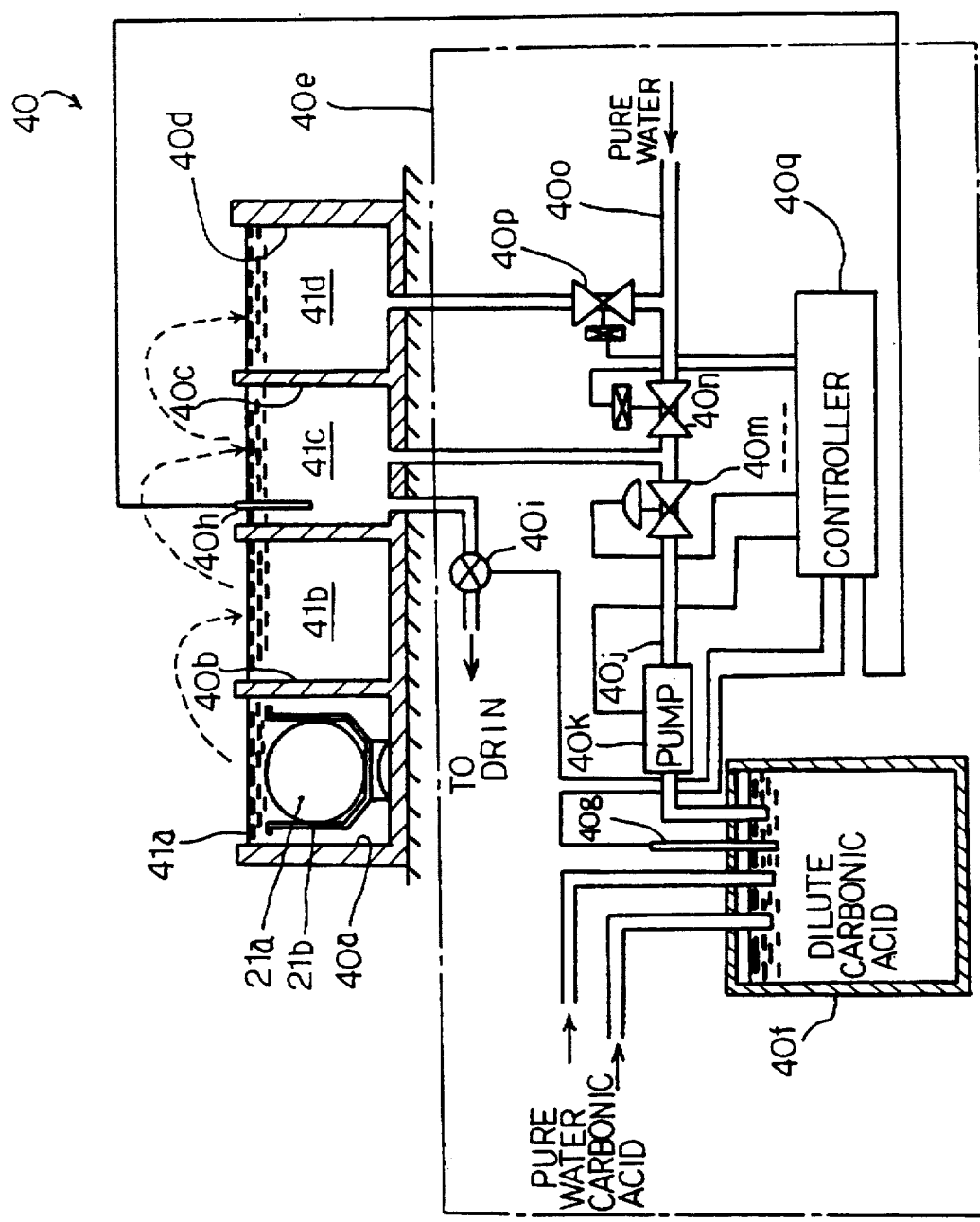
FIG. 7 is a schematic view showing yet another wet treatment system used in the method according to the present invention.

Turning to FIG. 7 of the drawings, yet another wet treatment system 40 embodying the present invention largely comprises four vessels 40a, 40b, 40c and 40d and a liquid supply sub-system 40e. The four vessels 40a to 40d are respectively assigned to organic alkaline solvent 41a, isopropyl alcohol 41b, dilute carbonic acid 41c and pure water 41d. Although the liquid supply sub-system 40e supplies the organic alkaline solvent 41a and the isopropyl alcohol 41b to the first and second vessels 40a and 40b, respectively, reservoir tanks for the organic alkaline solvent and the isopropyl alcohol and conduits to the first and second vessels 40a/40b are deleted from FIG. 7 for the sake of simplicity.

The liquid supply sub-system 40e includes a mixing tank 40f, pH sensors 40g, 40h and 40i, a conduit 40j from the mixing tank 40f to the third vessel 40c, a conveying pump 40k for the dilute carbonic acid, a solenoid-operated flow control valve 40m, a solenoid-operated strop valve 40n, a conduit for the pure water, a solenoid-operated stop valve 40p and a controller 40q. A conveying pump (not shown) supplies the pure water 41d from a reservoir tank (not shown) through the conduit 40o to the fourth vessel 40d.

Though not shown in FIG. 7, carbonic acid and pure water are supplied from reservoir tanks (not shown) to the mixing tank 40f, and the pH sensor 40g detects the pH of the dilute carbonic acid. The pH of the dilute carbonic acid is reported to the controller 40q, and the controller 40q regulates the pH of the dilute carbonic acid to 4–4.5 by changing the valve positions of solenoid-operated flow control valves (not shown) inserted between the reservoir tanks for the carbonic acid and the pure water and the mixing tank 40f.

Figure 8:
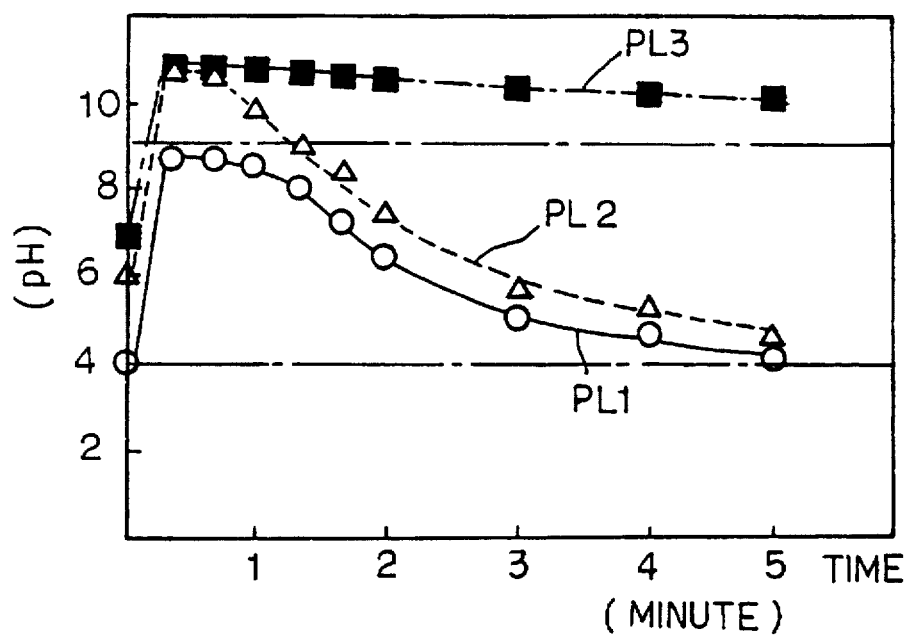
FIG. 8 is a graph showing variation of pH in a neutralization vessel in terms of initial pH value.

The controller 40q further monitors the pH of dilute carbonic acid through the pH sensors 40h and 40i. Even if the residual organic alkaline solvent is replaced with isopropyl alcohol, the organic alkaline solvent still remains in the semiconductor structure, and the residual organic alkaline solvent is equivalent to the quantity which covers 0.1 percent of the total surface area of the semiconductor structures fabricated on the semiconductor wafer 21a. FIG. 8 illustrates the pH in the third vessel 40c. If the dilute carbonic acid in the third vessel 40c is regulated to ph=4, the residual organic alkaline solvent varies the pH of the liquid as indicated by Plots PL1. The dilute carbonic acid at pH=6 is varied over pH=10, as indicated by Plots PL2. However, if the dilute carbonic acid is not supplemented, the pH in the third vessel 40c is maintained over pH=10, as indicated by plots Pl3. Such strong alkaline liquid damages the lower wiring 1. For this reason, it is recommendable to initially regulate pH of the dilute carbonic acid to within a range of between 4 to 4.5. Moreover, when the residual organic alkaline solvent increases the pH in the third vessel 40c, the pH sensors 40h and 40i convey the large pH value to the controller 40q, and the controller 40q starts the pump 40k so as to partially replace the liquid in the third vessel 40c with the dilute carbonic acid. The controller 40q changes the valve position of the solenoid-operated flow control valve 40m, and regulates the pH in the third vessel 40c between 4 and 9. For this reason, the lower wiring 1 is not damaged in the peeling/cleaning method according to the present invention.

Using the wet treatment system 40, a manufacturer peels the photo-resist etching mask 4 from the semiconductor structure, and cleans the semiconductor structure as follows. First, the first, second, third and fourth vessels 40a to 40d are respectively filled with the organic alkaline solvent 41a, the isopropyl alcohol 41b, the dilute carbonic acid 41c and the pure water 41d.

When the organic alkaline solvent 41a, the isopropyl alcohol 41b, the dilute carbonic acid 41c and the pure water 41d are prepared in the first vessel 40a, the second vessel 40c, the third vessel 40c and the fourth vessel 40d, respectively, the manufacturer dips the semiconductor wafers 21a mounted on the boat 21b into the organic alkaline solvent 41a for a certain time period. The photo-resist etching mask 4 is peeled off in the organic alkaline solvent 41a, and the organic alkaline solvent 41a may remain in the contact hole 3a.

The semiconductor wafers 21a are lifted from the organic alkaline solvent 41a together with the boat 21b, and are dipped into the isopropyl alcohol 41b for a certain time period. The residual organic alkaline solvent 41a on the surface of the semiconductor structure is replaced with the isopropyl alcohol 41b. However, all the residual organic alkaline solvent in the via-holes 3a is not completely replaced with the isopropyl alcohol 41b, and still remains in the contact holes 3a.

The manufacturer lifts the semiconductor wafers 21a mounted on the boat 21b from the isopropyl alcohol 41b, and dips them into the dilute carbonic acid 41c in the third vessel 40c for a certain time period. Even if the residual organic alkaline solvent remains in the via-holes 3a, the dilute carbonic acid neutralizes the organic alkaline solvent. If the residual organic alkaline solvent increases the pH in the third vessel 40c, the dilute carbonic acid is supplied from the mixing tank 40f to the third vessel 40c, and the liquid in the third vessel 40c is partially replaced with the dilute carbonic acid so as to lower the pH in the third vessel 40c as described hereinbefore. Thus, the organic alkaline solvent is perfectly removed from the semiconductor structure, and the liquid does not damage the lower wiring 1 in the third vessel 40c.

When the neutralization is completed, the semiconductor wafers 21a are lifted from the third vessel 40c, and are rinsed in the pure water in the fourth vessel 40d. The dilute carbonic acid does not erode the lower wiring 1 of aluminum, and the manufacturer does not require the time for the rinse in the fourth vessel 40d to be strictly controlled.

The residual organic alkaline solvent has been already perfectly removed from the semiconductor structure, and strong alkaline solution is not produced in the via-holes 3a. For this reason, the semiconductor structure cleaned through the above described method is free from the undesirable disconnection.

Moreover, the acid solution and the pure water are initially prepared in the third and fourth vessels 40c and 40d, respectively, and, for this reason, the control for the third embodiment is simpler than those of the first and second embodiments.

In this instance, carbonic acid is used for the neutralization. Acetic acid or ($CH_3COOH$) may be filled in the third vessel 40c. Carbon dioxide gas may be supplied into the mixing tank 40f, and the carbonic acid may be directly supplied from the reservoir tank to the third vessel 40c.

Fourth Embodiment

Figure 9:
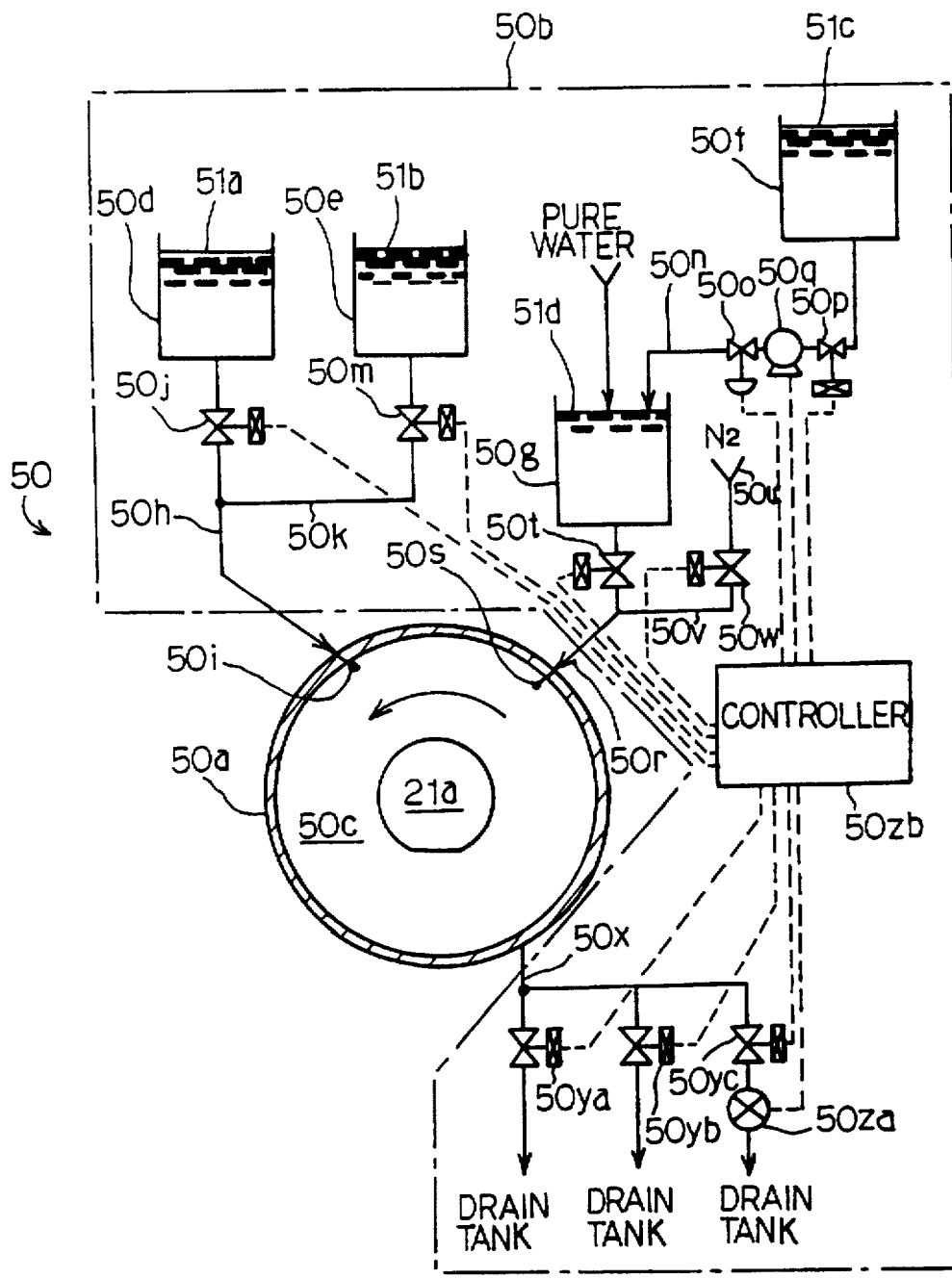
FIG. 9 is a schematic view showing still another wet treatment system used in the method according to the present invention.

Turning to FIG. 9 of the drawings, still another wet treatment system 50 embodying the present invention largely comprises a vessel 50a and a spray sub-system 50b. The vessel 50a defines a chamber 50c, and a turn table (not shown) is installed in the chamber 50c. The semiconductor wafer 21a is mounted on the turn table, and is rotated together with the turn table.

The spray sub-system 50b includes three reservoir tanks 50d, 50e and 50f and a mixing tank 50g. Organic alkaline solvent 51a, isopropyl alcohol 51b and carbonic acid 51c are stored in the reservoir tanks 50d, 50e and 50f, respectively. The reservoir tank 50d is connected through a conduit 50h to a spray nozzle 50i projecting into the chamber 50c, and a solenoid-operated stop valve 50j is inserted into the conduit 50h. The reservoir tank 51b is connected through a conduit 50k to the conduit 50h, and a solenoid-operated stop valve 50m is inserted in the conduit 50k. Though not shown in FIG. 9, a suitable pump pressurizes the organic alkaline solvent and the isopropyl alcohol. Thus, the organic alkaline solvent 51a and the isopropyl alcohol 51b are selectively supplied to the spray nozzle 50i.

The reservoir tank 50f is connected to the mixing tank 50g through a conduit 50n, and a solenoid-operated flow control valve 50o, a solenoid-operated stop valve 50p and a conveying pump 50q are inserted in the conduit 50n. The mixing tank 50g is further connected to a pure water source (not shown) and pure water is supplied to the mixing tank 50g. Thus, the carbonic acid 51c is mixed with the pure water, and dilute carbonic acid 51d is store d in the mixing tank 50g. The mixing tank 50g is connected through a conduit 50r to a spray nozzle 50s projecting into the chamber 50c, and a solenoid-operated stop valve 50t is inserted into the conduit 50r. A suitable pump pressurizes the dilute carbonic acid 51d, and supplies the pressurized dilute carbonic acid 51d to the spray nozzle 50s. A source of nitrogen gas 50u is connected through a gas conduit 50v to the conduit 50r, and a solenoid-operated stop valve 50w is inserted into the gas conduit 50v.

The spray sub-system 50b further includes a drain pipe 50x connected to the vessel 50a, and the drain pipe 50x is branched into three lines. The three lines are respectively connected to three drain tanks (not shown), and solenoid-operated stop valves 50ya, 50yb and 50yc are respectively inserted in the three lines so as to selectively guide waste liquid to the three drain tanks. The rightmost line is assigned to the dilute carbonic acid 5d, and a pH sensor 50za monitors pH of the liquid passing through the rightmost line. The pH sensor 50za reports the detected pH to a controller 50b, and the controller 50zb changes the valve position of the solenoid-operated flow control valve 50o so as to change pH of the dilute carbonic acid 51d.

Using the wet treatment system 50, a manufacturer peels the photo-resist mask 4 off, and cleans the semiconductor structures fabricated on the semiconductor wafers 21a as follows. First, the manufacturer places the semiconductor wafer 21a on the turn table, and starts to rotate the turn table. The organic alkaline solvent 51a and the isopropyl alcohol 51b are stored in the reservoir tanks 50d and 50e, and pH of the dilute carbonic acid 51d is regulated to 4.0 to 4.5.

The controller 50zb changes the solenoid-operated stop valves 50j and 50ya an to open state, and the spray nozzle 50i spreads the organic alkaline solvent 51a toward the semiconductor wafer 21a for a certain time period. The photo-resist etching mask 4 is peeled off, and the waste organic alkaline solvent flows into the drain tank.

Subsequently, the controller 50zb closes the solenoid-operated stop valves 50j and 50ya, and opens the solenoid-operated stop valves 50m and 50yb. The isopropyl alcohol 51b is sprayed from the spray nozzle 50i for a certain time period, and residual organic alkaline solvent on the semiconductor wafer 21a is replaced with the isopropyl alcohol 51b. However, it is difficult to perfectly replace the residual organic alkaline solvent with the isopropyl alcohol 51b.

Finally, the controller 50zb closes the solenoid-operated stop valves 50m and 50yb, and opens the solenoid-operated stop valves 50t and 50yz. The dilute carbonic acid 51d is sprayed from the spray nozzle 50s to the semiconductor wafer 21 a for a certain time period, and neutralizes the residual organic alkaline solvent on the semiconductor structures. While the dilute carbonic acid is being sprayed, the pH sensor 50za reports the detected pH of the waste liquid to the controller 50zb, and the controller 50zb changes the valve position of the solenoid-operated flow control valve 50o so as to keep pH of the waste liquid between 4 to 9.

Upon completion of the neutralization, the controller 50zb stops the pump 50q, and closes the valves 50o and 50p. The carbonic acid is not supplied to the mixing tank 50g, and the controller 50zb opens the solenoid-operated stop valve 50t so as to blow out the nitrogen gas. Only the pure water is supplied to the mixing tank 50g, and the pure water is sprayed from the spray nozzle 50s to the semiconductor wafer 21a. Thus, the semiconductor structures are rinsed with the pure water.

The residual organic alkaline solvent has been already perfectly removed from the semiconductor structure, and strong alkaline solution is not produced in the via-holes 3a. For this reason, the semiconductor structure cleaned through the above described method is free from the undesirable disconnection.

In this instance, carbonic acid is used for the neutralization. Acetic acid may be filled in the mixing tank 50g. Carbon dioxide gas may be supplied into the mixing tank 50g, and a mass flow controller changes the flow rate of carbon dioxide gas.

Fifth Embodiment

Figure 10:
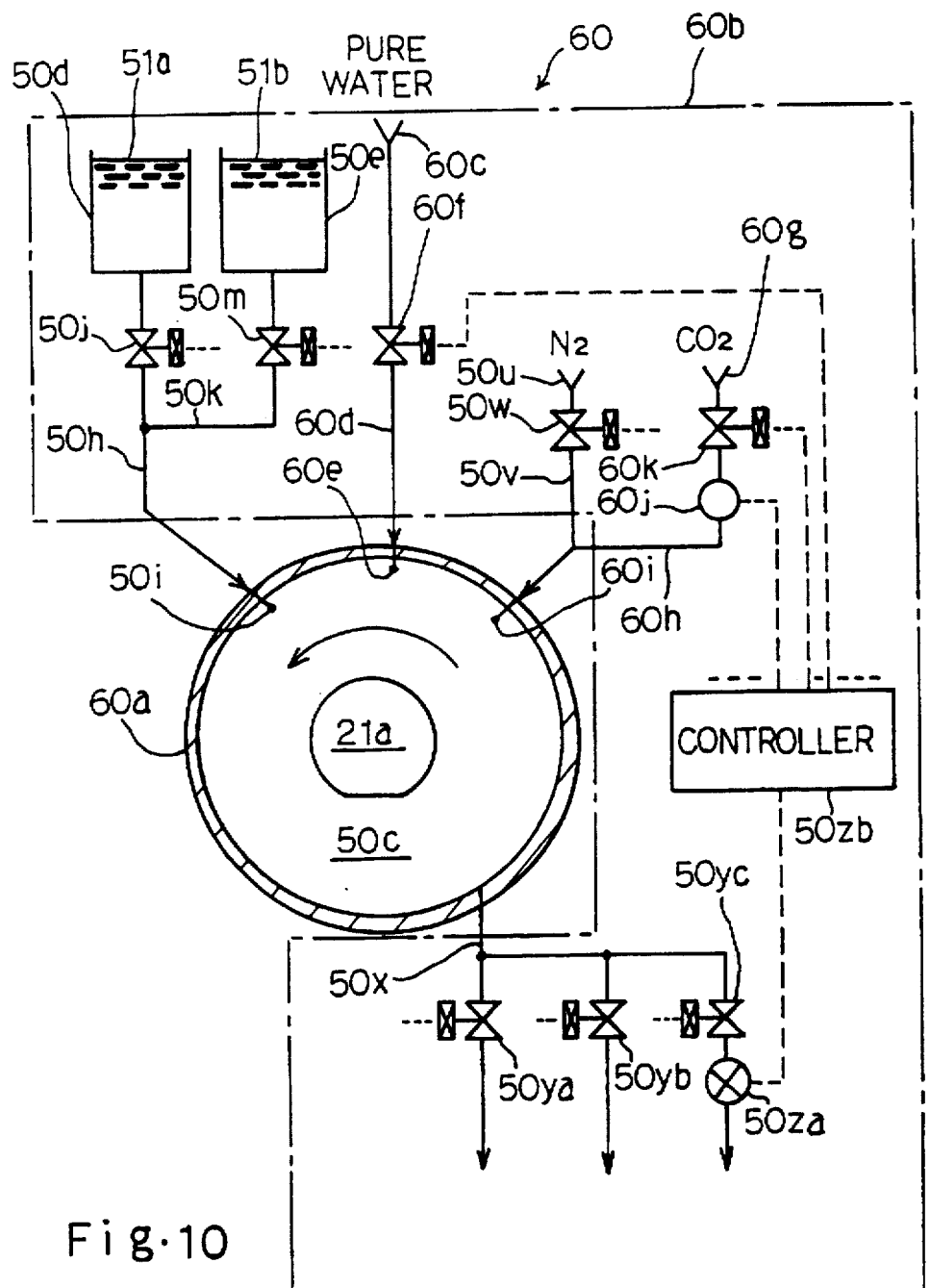
FIG. 10 is a schematic view showing still another wet treatment system used in the method according to the present invention.

Turning to FIG. 10 of the drawings, still another wet treatment system 60 embodying the present invention also largely comprises a vessel 60a and a spray sub-system 60b. The vessel 60a is similar to the vessel 50a, and is not detailed for the sake of simplicity. The spray sub-system 60b uses carbon dioxide gas instead of the carbonic acid, and the facility for the carbonic acid is replaced with a facility of carbon dioxide gas. For this reason, description is focused on the facility for carbon dioxide gas, and other components are labeled with the references designating corresponding components of the spray sub-system 50b without detailed description.

A source of pure water 60c is connected through a conduit 60d to a spray nozzle 60e, and a solenoid-operated stop valve 60f is inserted in the conduit 60f. Thus, the pure water is directly sprayed to the semiconductor wafer 21a.

A source of carbon dioxide gas 60 is connected through a gas conduit 60h and the gas conduit 50v to a gas spray nozzle 60i, and a mass flow meter 60j and a solenoid-operated strop valve 60k are inserted into the gas conduit 60h. Thus, the nitrogen gas and the carbon dioxide gas are selectively sprayed from the gas nozzle 60i.

Using the wet treatment system 60, a manufacturer peels the photo-resist mask 4 off, and cleans the semiconductor structures fabricated on the semiconductor wafers 21a as follows. First, the manufacturer places the semiconductor wafer 21a on the turn table, and starts to rotate the turn table. The organic alkaline solvent 51a and the isopropyl alcohol 51b are stored in the reservoir tanks 50d and 50erespectively.

The controller 50zb changes the solenoid-operated stop valves 50j and 50ya to an open state, and the spray nozzle 50i sprays the organic alkaline solvent 51a toward the semiconductor wafer 21a for a certain time period. The photo-resist etching mask 4 is peeled off, and the waste organic alkaline solvent flows through the solenoid-operated stop valve 50ya into the drain tank.

Subsequently, the controller 50zb closes the solenoid-operated stop valves 50j and 50ya, and opens the solenoid-operated stop valves 50m and 50yb. The isopropyl alcohol 51b is sprayed from the spray nozzle 50i for a certain time period, and residual organic alkaline solvent on the semiconductor wafer 21a is replaced with the isopropyl alcohol 51b. However, it is difficult to perfectly replace the residual organic alkaline solvent with the isopropyl alcohol 51b.

Subsequently, the controller 50zb closes the solenoid-operated stop valves 50m and 50yb, and opens the solenoid-operated stop valve 60k. The carbon dioxide gas is blown from the spray nozzle 60i into the chamber 50c. The carbon dioxide gas penetrates into the contact holes 3a. The controller 50zb opens the solenoid-operated stop valve 60f, and the pure water is sprayed from the spray nozzle 60e toward the semiconductor wafer 21a. The pure water penetrates into the contact holes 3a, and is brought into contact with the carbon dioxide gas. Then, the carbonic acid is produced into the contact holes 3a, and neutralizes the residual organic alkaline solution in the contact holes 3a. While the carbonic acid is neutralizing the residual organic alkaline solvent, the waste liquid flows through the pH sensor 50za into the drain tank, and the pH sensor 50za reports pH of the waste liquid to the controller 50zb. The controller 50zb instructs the mass flow meter 60j to change the flow rate of the carbon dioxide gas, and controls pH of waste liquid between 4 to 9.

Upon completion of the neutralization, the controller 50zb closes the solenoid-operated stop valve 60k, and opens the solenoid-operated stop valve 50w. Then, nitrogen gas is blown from the gas nozzle 60i, and the semiconductor wafer 21a is rinsed with the pure water.

In this instance, the carbon dioxide gas is blown after the treatment of the isopropyl alcohol 50b. However, the carbon dioxide gas may be blown during the treatment with the isopropyl alcohol 50b.

The residual organic alkaline solvent has been already perfectly removed from the semiconductor structure, and strong alkaline solution is not produced in the via-holes 3a. For this reason, the semiconductor structure cleaned through the above described method is free from the undesirable disconnection.

Although particular embodiments of the present invention have been shown and described, it will be obvious to those skilled in the art that various changes and modifications may be made without departing from the spirit and scope of the present invention.

For example, the semiconductor wafers may be dipped into acid after the treatment of the organic alkaline solvent.

More than one kind of acid may be mixed for the treatment with the acid, and may be selected from hydrochloric acid, sulfuric acid or nitric acid, carbonic acid, acetic acid and electrolyzed water.

What is claimed is:

1. A method of peeling a photo-resist layer from a semiconductor structure, comprising the steps of:
    a) preparing a semiconductor structure partially covered with a photo-resist layer, said semiconductor structure having at least one contact hole;
    b) treating said semiconductor structure and said photo-resist layer with organic alkaline solvent for peeling said photo-resist layer off;
    c) treating said semiconductor structure with acid for neutralizing residue of said organic alkaline solvent left in said at least one contact hole; and
    d) cleaning said semiconductor structure with pure water for cleaning said semiconductor structure.

2. The method as set forth in claim 1, further comprising the step of treating said semiconductor structure with alcohol solution between said step b) and said step c).

3. The method as set forth in claim 2, wherein said alcohol solution is isopropyl alcohol.

4. The method as set forth in claim 2, wherein said organic alkaline solvent, said alcohol solution, said acid and said pure water are stored in first, second, third and fourth vessels, respectively, and said semiconductor structure is moved from said first vessel through said second vessel and said third vessel to said fourth vessel.

5. The method as set forth in claim 2, wherein said organic alkaline solvent, said alcohol solution, said acid and said pure water are sprayed toward said semiconductor structure.

6. The method as set forth in claim 1, wherein said acid is stored in a vessel in said step c), said method further comprising the step of replacing said acid with said pure water in said vessel between said step c) and said step d).

7. The method as set forth in claim 1, wherein said acid is selected from the group consisting of hydrochloric acid, sulfuric acid, nitric acid, carbonic acid, acetic acid, electrolyzed water or a mixture of at least two of said acids.

8. The method as set forth in claim 1, wherein said acid is produced from pure water and carbon dioxide gas in said step c).

9. The method as set forth in claim 1, wherein said step c) includes the sub-steps of:
    c-1) blowing said carbon dioxide gas to said semiconductor structure; and
    c-2) spraying said pure water to said semiconductor structure.

10. The method as set forth in claim 1, wherein said acid is regulated to have pH ranging between 4 and 6.

11. The method as set forth in claim 1, wherein pH of a liquid reacting with said acid is regulated between 4 and 9 during said step c).

12. The method as set forth in claim 1, wherein said step c) is performed for a time sufficient to neutralize said residue of said organic alkaline solvent left in said at least one contact hole after said step b) has been completed.

13. A method of peeling a photo-resist layer from a semiconductor structure, comprising the steps of:

a) preparing a semiconductor structure partially covered with a photo-resist layer, said semiconductor structure having at least one contact hole;

b) placing said semiconductor structure onto a turn table;

c) moving said turn table to a first position and spraying said semiconductor structure and said photo-resist layer with organic alkaline solvent for peeling said photo-resist layer off; d) moving said turn table to a second position and spraying said semiconductor structure with alcohol solution;

e) moving said turn table to a third position and spraying said semiconductor structure with carbonic acid for neutralizing residue of said organic alkaline solvent left in said at least one contact hole;

f) monitoring a pH of waste liquid during said step d);

g) based on the pH monitored in said step e), controlling an amount of said carbonic acid sprayed onto said semiconductor structure to maintain the pH of the waste liquid in a range between 4 and 4.5; and h) moving said turn table to a fourth position and treating said semiconductor structure with pure water for cleaning said semiconductor structure.

14. A method of peeling a photo-resist layer from a semiconductor structure, comprising the steps of:

a) preparing a semiconductor structure partially covered with a photo-resist layer, said semiconductor structure having at least one contact hole;

b) treating said semiconductor structure and said photo-resist layer with organic alkaline solvent in a first vessel for peeling said photo-resist layer off;

c) treating said semiconductor structure with alcohol solution in a second vessel;

d) treating said semiconductor structure with carbonic acid in a third vessel for neutralizing residue of said organic alkaline solvent left in said at least one contact hole;

e) monitoring a pH in said third vessel during the step d);

f) based on the pH monitored in said step e), controlling an amount of said carbonic acid applied to said third vessel to maintain the pH in said third vessel in a range between 4 and 4.5; and g) treating said semiconductor structure with pure water in a fourth vessel for cleaning said semiconductor structure.

\* \* \* \* \*